(12) United States Patent  (10) Patent No.: US 8,216,923 B2
Bateman et al.  (45) Date of Patent: Jul. 10, 2012

(54) INTEGRATED SHADOW MASK/CARRIER FOR PATTERNED ION IMPLANTATION

(75) Inventors: Nicholas Bateman, Reading, MA (US);
Kevin Daniels, Lynnfield, MA (US);
Atul Gupta, Beverly, MA (US); Russell Low, Rowley, MA (US); Benjamin Riordon, Newburyport, MA (US);
Robert Mitchell, Winchester, MA (US);
Steven Anella, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/895,927

(22) Filed: Oct. 1, 2010

(65) Prior Publication Data

US 2012/0083102 A1 Apr. 5, 2012

(51) Int. Cl.
*H01L 21/425* (2006.01)

(52) U.S. Cl. . 438/514; 438/519; 438/527; 257/E21.042; 257/E21.043; 257/E21.057; 250/491.1; 250/492.2; 250/492.22

(58) Field of Classification Search .................. 438/514, 438/519, 527, 546; 257/E21.042, E21.043, 257/E21.057; 250/491.1, 492.2, 492.22, 250/492.23

See application file for complete search history.

(56) References Cited

U.S. PATENT DOCUMENTS

| | | | |
|---|---|---|---|
| 4,086,102 A | 4/1978 | King | |
| 4,448,865 A | 5/1984 | Bohlen et al. | |
| 5,753,531 A | 5/1998 | Frey | |
| 6,335,534 B1 | 1/2002 | Suguro et al. | |
| 6,930,316 B2 | 8/2005 | Nishihashi et al. | |
| 7,727,866 B2 | 6/2010 | Bateman et al. | |
| 7,776,727 B2 | 8/2010 | Borden | |
| 2005/0104014 A1* | 5/2005 | Gurovich | 250/493.1 |
| 2007/0080407 A1* | 4/2007 | Kono | 257/370 |
| 2009/0227062 A1 | 9/2009 | Sullivan et al. | |
| 2010/0037939 A1* | 2/2010 | Eickelmann et al. | 136/255 |
| 2010/0062589 A1 | 3/2010 | Anella et al. | |
| 2010/0124799 A1 | 5/2010 | Blake et al. | |
| 2010/0304519 A1* | 12/2010 | Eickelmann et al. | 438/68 |
| 2011/0073173 A1* | 3/2011 | Hwang | 136/255 |
| 2011/0095388 A1* | 4/2011 | Richter et al. | 257/432 |

FOREIGN PATENT DOCUMENTS

WO 2009155498 A2 12/2009

* cited by examiner

*Primary Examiner* — Hsien Ming Lee

(57) ABSTRACT

An improved, lower cost method of processing substrates, such as to create solar cells is disclosed. In addition, a modified substrate carrier is disclosed. The carriers typically used to carry the substrates are modified so as to serve as shadow masks for a patterned implant. In some embodiments, various patterns can be created using the carriers such that different process steps can be performed on the substrate by changing the carrier or the position with the carrier. In addition, since the alignment of the substrate to the carrier is critical, the carrier may contain alignment features to insure that the substrate is positioned properly on the carrier. In some embodiments, gravity is used to hold the substrate on the carrier, and therefore, the ions are directed so that the ion beam travels upward toward the bottom side of the carrier.

20 Claims, 17 Drawing Sheets

| Starting Row | After 0 shifts | After 1 shift | After 2 shifts |
|---|---|---|---|
| A | A | | |
| B | B | A+B | |
| C | C | B+C | A+B+C |
| A | | A+C | A+B+C |
| B | | | A+B+C |

FIG. 12

INTEGRATED SHADOW MASK/CARRIER FOR PATTERNED ION IMPLANTATION

BACKGROUND

Solar cells are typically manufactured using the same processes used for other semiconductor devices, often using silicon as the substrate material. A semiconductor solar cell is a device having an in-built electric field that separates the charge carriers generated through the absorption of photons in the semiconductor material. This electric-field is typically created through the formation of a p-n junction (diode) which is created by differential doping of the semiconductor material. Doping a part of the semiconductor substrate (e.g. surface region) with impurities of opposite polarity forms a p-n junction that may be used as a photovoltaic device converting light into electricity.

FIG. 1 shows a cross section of a representative solar cell 100. Photons 101 enter the solar cell 100 through the top surface 105, as signified by the arrows. These photons pass through an anti-reflective coating 110, designed to maximize the number of photons that penetrate the solar cell 100 and minimize those that are reflected away from the solar cell 100.

Internally, the solar cell 100 is formed so as to have a p-n junction 120. This junction is shown as being substantially parallel to the top surface 105 of the solar cell 100 although there are other implementations where the junction may not be parallel to the surface. The solar cell is fabricated such that the photons enter the substrate through the n-doped region, also known as the emitter 130. While this disclosure describes p-type bases and n-type emitters, n-type bases and p-type emitters can also be used to produce solar cells and are within the scope of the disclosure. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron hole (e-h) pairs need to be separated. This is done through the built-in electric field at the p-n junction. Thus any e-h pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse across the depth of the emitter 130 to reach the depletion region and get swept across to the other side. Thus to maximize the collection of photo-generated current and minimize the chances of carrier recombination in the emitter 130, it is preferable to have the emitter 130 be very shallow.

Some photons 101 pass through the emitter region 130 and enter the base 140. These photons 101 can then excite electrons within the base 140, which are free to move into the emitter 130, while the associated holes remain in the base 140. As a result of the charge separation caused by the presence of this p-n junction 120, the extra carriers (electrons and holes) generated by the photons 101 can then be used to drive an external load to complete the circuit.

By externally connecting the emitter 130 to the base 140 through an external load, it is possible to conduct current and therefore provide power. To achieve this, contacts 150a and 150b, typically metallic, are placed on the outer surface of the emitter 130 and the base 140. Since the base 140 does not receive the photons 101 directly, typically its contact 150b is placed along the entire outer surface of the base 140. In contrast, the outer surface of the emitter 130 receives photons 101 and therefore cannot be completely covered with contacts 150a. However, if the electrons have to travel great distances to the contact, the series resistance of the cell increases, which lowers the power output. In an attempt to balance these two considerations; the distance that the free electrons must travel to the contact 150a or 150b, and the amount of exposed emitter surface 160 illustrated in FIG. 2; most applications use contacts 150a that are in the form of fingers. FIG. 2 shows a top view of the solar cell of FIG. 1. The contacts 150a are typically formed so as to be relatively thin, while extending the width of the solar cell 100. In this way, free electrons need not travel great distances, but much of the outer surface of the emitter is exposed to the photons. Typical contacts 150a on the front side of the substrate are 0.1 mm wide, with an accuracy of approximately +/−0.1 mm. These contacts 150a are typically spaced between 1-5 mm apart from one another. While these dimensions are typical, other dimensions are possible and contemplated herein.

A further enhancement to solar cells is the addition of heavily doped substrate contact regions. FIG. 3 shows a cross section of this enhanced solar cell. The solar cell 100 is as described above in connection with FIG. 1, but includes heavily n-doped contact regions 170. These heavily doped contact regions 170 correspond to the areas where the contacts 150a will be affixed to the solar cell 100. The introduction of these heavily doped contact regions 170 allows much better contact between the solar cell 100 and the contacts 150a and significantly lowers the series resistance of the solar cell 100. This pattern of including heavily doped regions on the surface of the substrate is commonly referred to as selective emitter (SE) design. These heavily doped regions may be created by implanting ions in these regions. Thus, the terms "implanted region" and "doped region" may be used interchangeably throughout this disclosure.

A selective emitter design for a solar cell also has the advantage of higher efficiency cells due to reduced minority carrier losses through recombination due to lower dopant/impurity dose in the exposed regions of the emitter layer. The higher doping under the contact regions provides a field that collects the majority carriers generated in the emitter and repels the excess minority carriers back toward the p-n junction.

Such structures are typically made using traditional lithography (or hard masks) and thermal diffusion. An alternative is to use implantation in conjunction with a traditional lithographic mask, which can then be removed easily before dopant activation. Yet another alternative is to use a shadow mask or stencil mask in the implanter to define the highly doped areas for the contacts. All of these techniques utilize a fixed masking layer (either directly on the substrate or upstream in the beamline).

All of these alternatives have drawbacks. For example, the processes enumerated above all contain multiple process steps. This causes the cost of the manufacturing process to be prohibitive and may increase substrate breakage rates. These options also suffer from the limitations associated with the special handling of solar cells, such as aligning the mask with the substrate and the cross contamination with materials that are dispersed from the mask during ion implantation.

Consequently, efforts have been made to reduce the cost and effort required to dope a pattern onto a substrate. While some of these efforts may be successful in reducing cost and processing time, often these modifications come at the price of reduced accuracy. Typically, in semiconductor processes, masks are very accurately aligned. Subsequent process steps rely on this accuracy. For example, referring to FIG. 4, after the heavily doped regions 170a-c have been implanted, contacts 150a are pasted to the substrate. Each of these processes is usually performed relative to some reference mark or fiducial. This mark may be an edge or corner of the substrate, or a specific mark or feature on the substrate. Since each of these process steps is typically referenced to a specific point, it is imperative that a high degree of accuracy be maintained. These efforts to reduce cost and processing steps degrade this accuracy, thereby potentially impacting the performance and yields of the devices made using these methods.

Therefore, there exists a need to produce solar cells where the number and complexity of the process steps is reduced, while maintaining adequate accuracy so that subsequent process steps are correctly positioned. While applicable to solar cells, the techniques described herein are applicable to other doping applications.

SUMMARY OF THE INVENTION

An improved, lower cost method of processing substrates, such as to create solar cells is disclosed. In addition, a modified substrate carrier is disclosed. The carriers typically used to carry the substrates are modified so as to serve as shadow masks for a patterned implant. In some embodiments, various patterns can be created using the carriers such that different process steps can be performed on the substrate by changing the carrier or the position with the carrier. In addition, since the alignment of the substrate to the carrier is critical, the carrier may contain alignment features to insure that the substrate is positioned properly on the carrier. In some embodiments, gravity is used to hold the substrate on the carrier, and therefore, the ions are directed so that the ion beam travels upward toward the bottom side of the carrier.

BRIEF DESCRIPTION OF THE FIGURES

FIG. 12 is a table showing the results of shifting substrates in a carrier having a plurality of different patterns.

DETAILED DESCRIPTION

Figure 4:
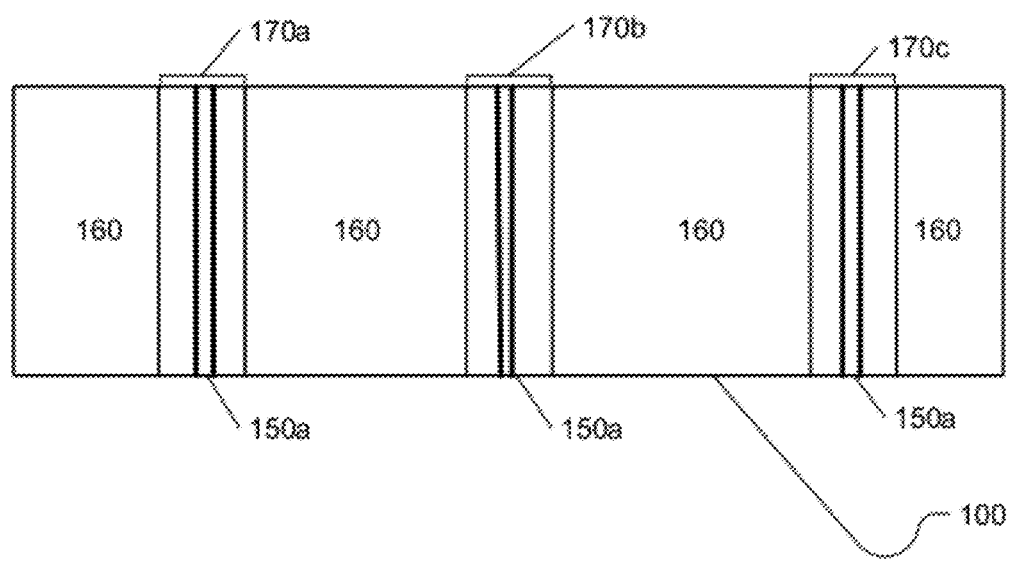
FIG. 4 shows a top view of the solar cell of FIG. 3.

FIG. 4 shows a top view of the solar cell manufactured using the methods of the present disclosure. The solar cell is formed on a semiconductor substrate 100. The substrate can be any convenient size, including but not limited to circular, rectangular, or square. Although not a requirement, it is preferable that the width of the solar cell 100 be less than the width of the ion beam used to implant ions in the solar cell 100. However, no such limitation exists with respect to the orthogonal direction of the solar cell. In other words, a solar cell 100 can be arbitrarily long, and can be in the shape of a roll of solar cell material. Typically, the substrates for solar cells 100 are very thin, often on the order of 300 microns thick or less.

Figure 6:
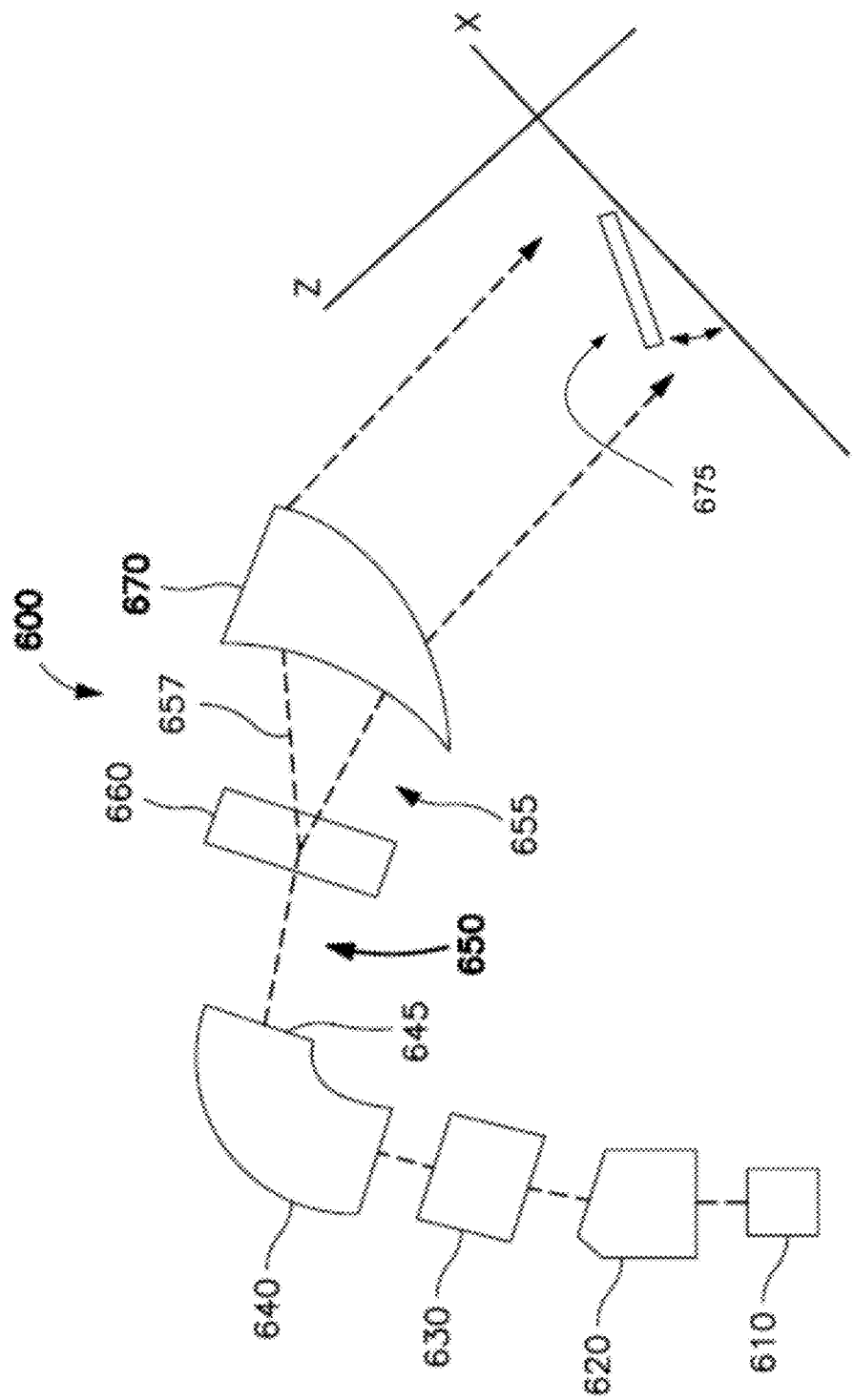
FIG. 6 is a representative illustration of an ion implanter used in accordance with an embodiment.

As described above, the solar cell has an n-doped emitter region and a p-doped base. The substrate is typically p-doped and forms the base, while ion implantation is used to create the emitter region. A block diagram of a representative ion implanter 600 is shown in FIG. 6. Of course, one skilled in the art will recognize that numerous other ion implanter designs exist and may be used. An ion source 610 generates ions of a desired species, such as phosphorus or boron. A set of electrodes (not shown) is typically used to attract the ions from the ion source 610. By using an electrical potential of opposite polarity to the ions of interest, the electrodes draw the ions from the ion source 610, and the ions accelerate through the electrode. These attracted ions are then formed into an ion beam 650, which then passes through a source filter 620. The source filter 620 is preferably located near the ion source 610. The ions within the ion beam 650 are accelerated/decelerated in column 630 to the desired energy level. A mass analyzer magnet 640, having an aperture 645, is used to remove unwanted components from the ion beam 650, resulting in an ion beam 650 having the desired energy and mass characteristics passing through resolving aperture 645.

In certain embodiments, the ion beam 650 is a spot beam. In this scenario, the ion beam 650 passes through a scanner 660, preferably an electrostatic scanner, which deflects the ion beam 650 to produce a scanned beam 655 wherein the individual beamlets 657 have trajectories which diverge from scanner 660. In certain embodiments, the scanner 660 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to uniformly expose the scanned beam 655 at every position of the substrate for nearly the same amount of time. Deviations from the triangle are used to make the beam uniform. The resultant electric field causes the ion beam to diverge as shown in FIG. 6.

An angle corrector 670 is adapted to deflect the divergent ion beamlets 657 into a set of ion beamlets 657 having substantially parallel trajectories. Preferably, the angle corrector 670 comprises a magnet coil and magnetic pole pieces that are spaced apart to form a gap, through which the ion beamlets 657 pass. The coil is energized so as to create a magnetic field within the gap, which deflects the ion beamlets 657 in accordance with the strength and direction of the applied magnetic field. The magnetic field is adjusted by varying the current through the magnet coil. Alternatively, other structures, such as parallelizing lenses, can also be utilized to perform this function.

Following the angle corrector 670, the scanned beam 655 is targeted toward the substrate, such as the solar cell to be processed. The scanned beam typically has a height (Y dimension) that is much smaller than its width (X dimension). This height is much smaller than the substrate, thus at any particular time, only a portion of the substrate is exposed to the ion beam. To expose the entire substrate to the scanned beam 655, the substrate may be moved relative to the beam location.

Figure 5:
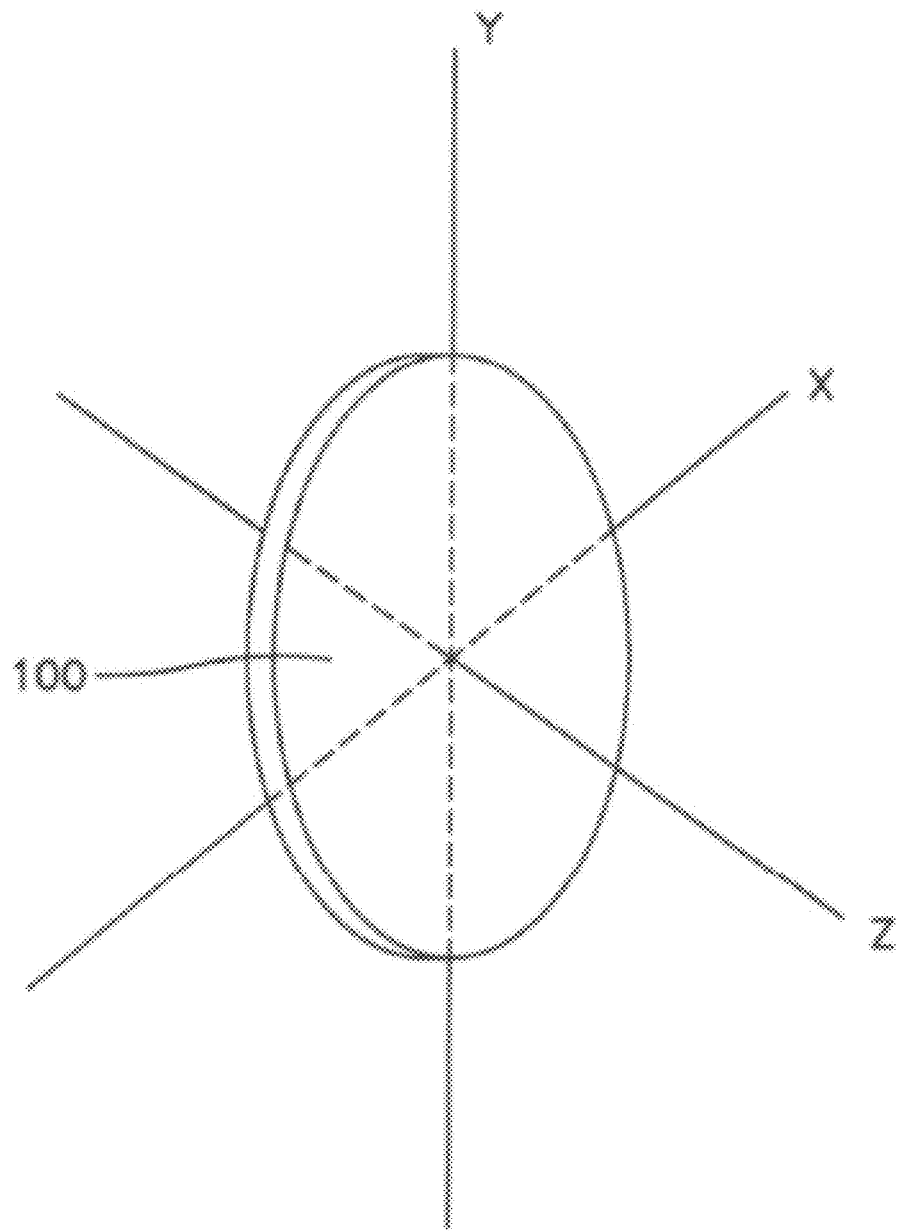
FIG. 5 shows a representative coordinate system.

The substrate, such as a solar cell, is attached to a substrate holder 675. The substrate holder 675 may provide a plurality of degrees of movement. For example, the substrate holder 675 can be moved in the direction orthogonal to the scanned beam 655. A sample coordinate system in shown in FIG. 5. Assume the beam is in the XZ plane. This beam can be a ribbon beam, or a scanned spot beam. The substrate holder can move in the Y direction. By doing so, the entire surface of the solar cell 100 can be exposed to the ion beam, assuming that the solar cell 100 has a smaller width than the ion beam (in the X dimension).

Substrates are moved into and from the process chamber through the use of carriers. In some embodiments, the carriers are rectangular, such as box shaped, and are capable of holding a plurality of substrates. In other embodiments, a separate, typically flat, carrier is used for each substrate. In one embodiment, the substrate is removed from the carrier and placed on the substrate holder 675 in preparation of processing, such as by a robotic arm. One reason to remove the substrate from the carrier may be to minimize cross-contamination for multi-species processes. After processing has been completed, the robotic arm returns the substrate to the carrier. The substrate, contained within the carrier, can now be transported outside the chamber. In another embodiment, the substrate remains in the carrier during the implant process. This allows the carrier to serve as an alignment reference for the substrate. This also allows the carrier to have a pattern on it which will serve as a mask in the presence of an ion beam.

There may be additional reasons to utilize a carrier. For example, a carrier supports the substrate in multiple axis during transport. If the substrate, for example, resides in a pocket of the carrier, the tool can move the substrate/carrier combination faster than if it relied exclusively on friction to the substrate (e.g., backside pads). Thus, with a fragile substrate constrained in the carrier, the handling system may be passively (e.g., pins) or actively (e.g., grabbers) held for more secure transport.

In addition, in some embodiments, a carrier can be made of conductive materials to form an electrical ground path to the substrate. In some embodiments, a carrier can be used to apply an electrical voltage to the substrate, such as a pulsed voltage for a plasma tool.

A carrier can easily be either adapted or replaced in an implanter to enable the handling of alternate substrate sizes or shapes.

Finally, once a substrate is rigidly constrained within a carrier, reliable positional references can be made to the carrier alone. In other words, locating to a kinematic pin feature in the carrier can be done repeatedly very accurately, and without risking substrate breakage.

In addition to beam line ion implanters, plasma doping systems can also be used. A plasma doping system forms a plasma containing the dopant using an electron cyclotron resonance plasma source, a helicon plasma source, a capacitively coupled plasma source, an inductively coupled plasma source, a DC glow discharge, a microwave source, or an RF source, as examples. The substrate, which is located within a chamber containing this plasma, is then biased using either a pulse or DC voltage and ions are accelerated into the surface of the substrate. Other ion implanters, including those with or without mass analysis, may be used.

Figure 7:
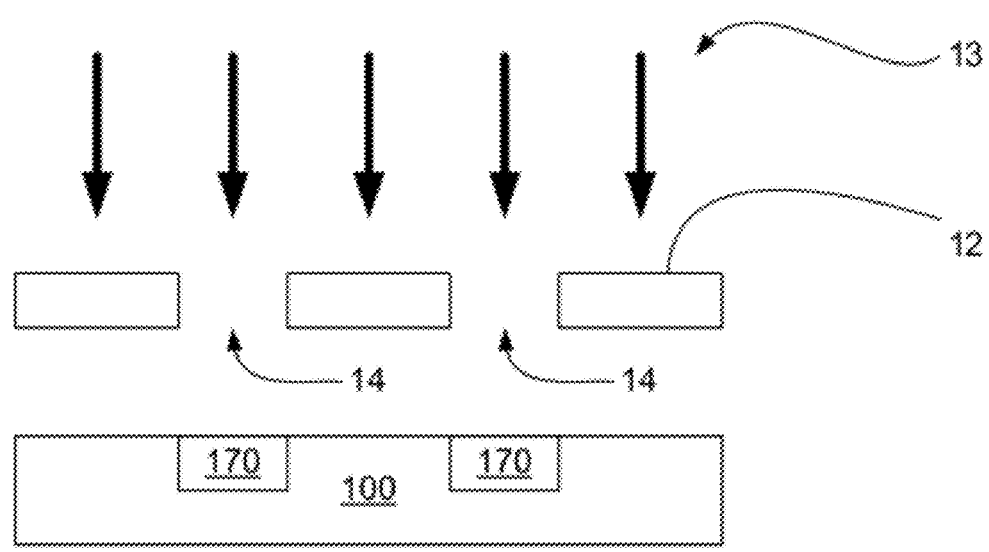
FIG. 7 shows a shadow mask being used to form the doped regions shown in FIG. 4.

There are a number of methods that can be used to create the doping pattern shown in FIG. 4. In some embodiment, the pattern is created by traditional implantation techniques. For example, an ion beam can be used to implant the surface of the solar cell 100 which is exposed to the beam. In some embodiments, the emitter 160 is doped using an ion implantation across the entire surface, also known as a blanket implant. The more heavily doped region 170 is then created using a mask. FIG. 7 shows a mask 12 disposed between the source of ions and the solar cell 100. The mask 12 includes one or more apertures 14 that allow the passage of ions 13. The mask 12 will block ions 13 that do not pass through the apertures 14. Those areas which are exposed to the ion beam become implanted or doped regions 170.

However, the use of a traditional shadow mask requires precise alignment processes. In some embodiments, the shadow mask is placed between the ion beam and the substrate holder 675, while the substrate is clamped to the substrate holder. In this embodiment, there is an alignment process that must be completed to properly orient the shadow mask to the clamped substrate. In some embodiments, the substrate is moved while the shadow mask is held stationary. In other embodiments, the substrate is held stationary while the shadow mask is moved to perform the alignment.

Figure 8A:
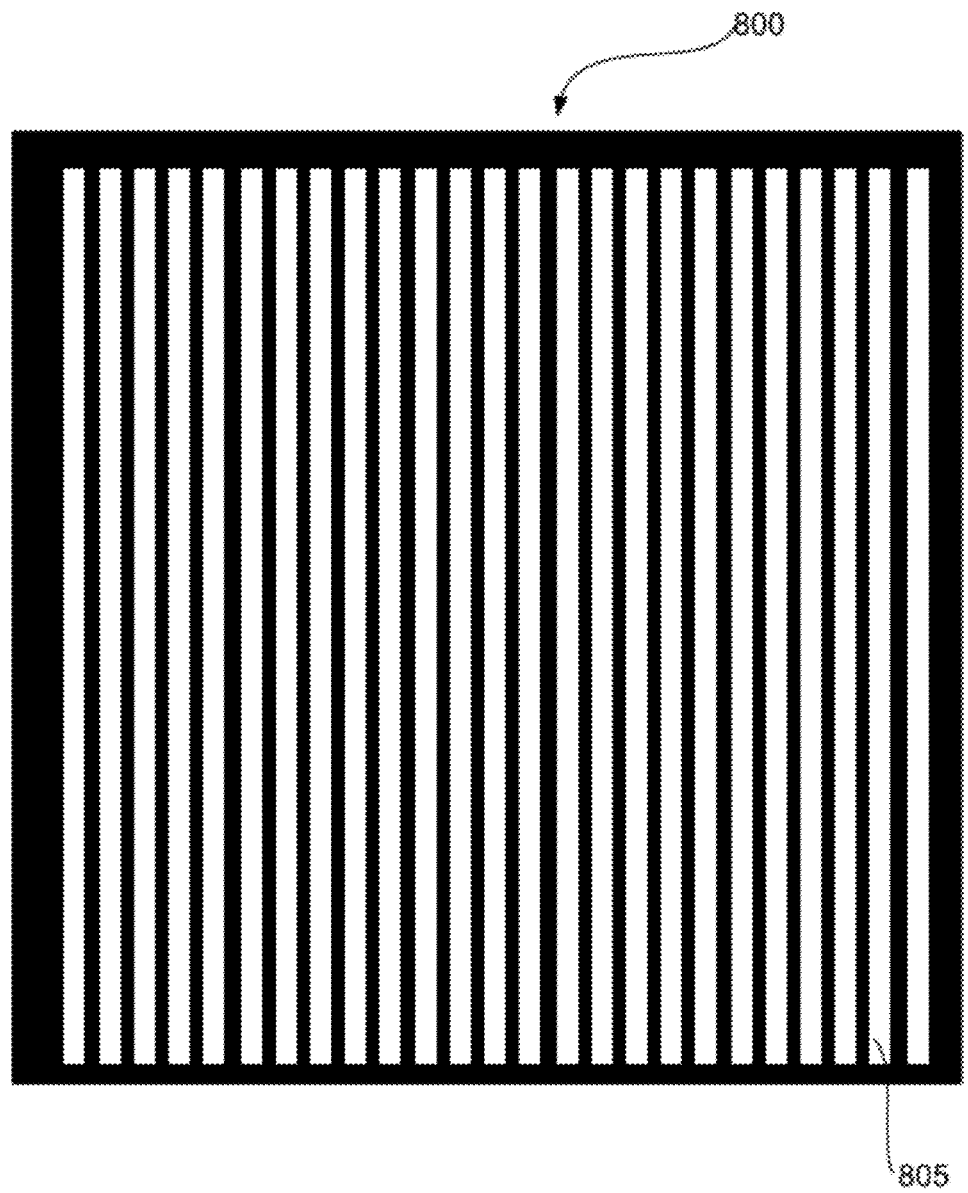
FIGS. 8A-8C show several embodiments in accordance with the present disclosure.

To eliminate these alignment processes, the present disclosure uses the substrate carrier as the shadow mask. In one embodiment, the substrates are placed flat on the substrate carrier. In some embodiments, alignment features are used to insure that the substrate is properly positioned on the carrier. In addition, one surface of the carrier, typically the bottom surface, has apertures or openings in the shape of the desired doping pattern. FIG. 8A shows a substrate carrier 800, which supports a single substrate. The substrate carrier 800 includes a plurality of slots or apertures 805, through which ions may pass, thereby allowing the exposed regions of the substrate resting on the carrier to be implanted. In some embodiments, the slots or apertures are the result of the removal of the material used to construct the carrier. In other embodiments, the slots are the result of the use of a material which allows the transmission of ions through it. In another embodiment, the bottom surface of the carrier 800 may be constructed by combining stacks of thin material and spacers, which form the desired pattern. In another embodiment, the solid parts of the bottom surface of the carrier may be wires tensioned across the substrate. In yet another embodiment, the carrier 800 may have a bottom surface that is substantially open. The carrier 800 could support or be independently aligned to a separate mask, which is positioned between the bottom surface of the carrier 800 and the substrate. In this embodiment, the carrier 800 supports the substrate, and the carrier 800 and/or mask are registered to a mask within the implanter. This "dual-registration" approach may allow the option of repeatably registering multiple masks to one substrate.

Figure 1:
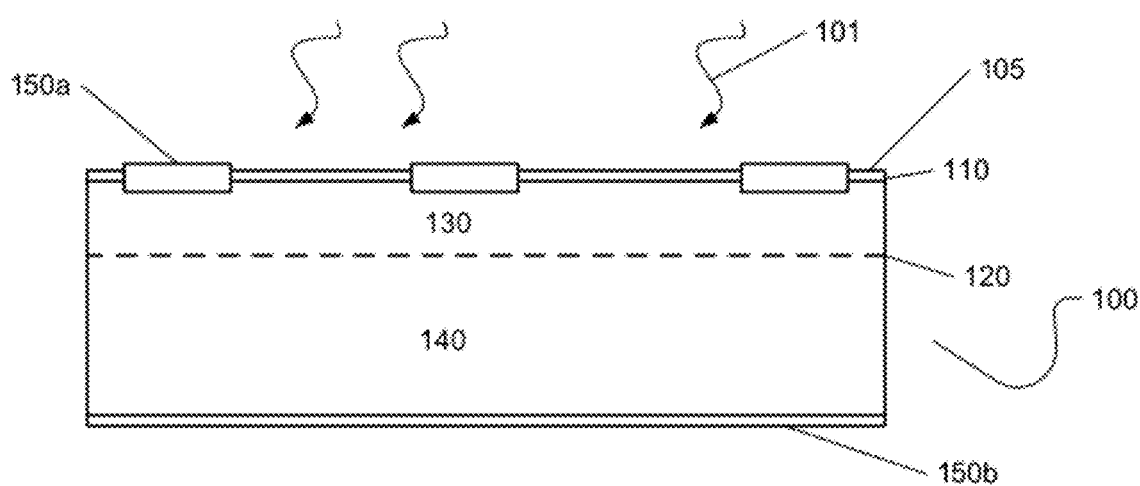
FIG. 1 shows a cross section of a solar cell of the prior art.
Figure 2:
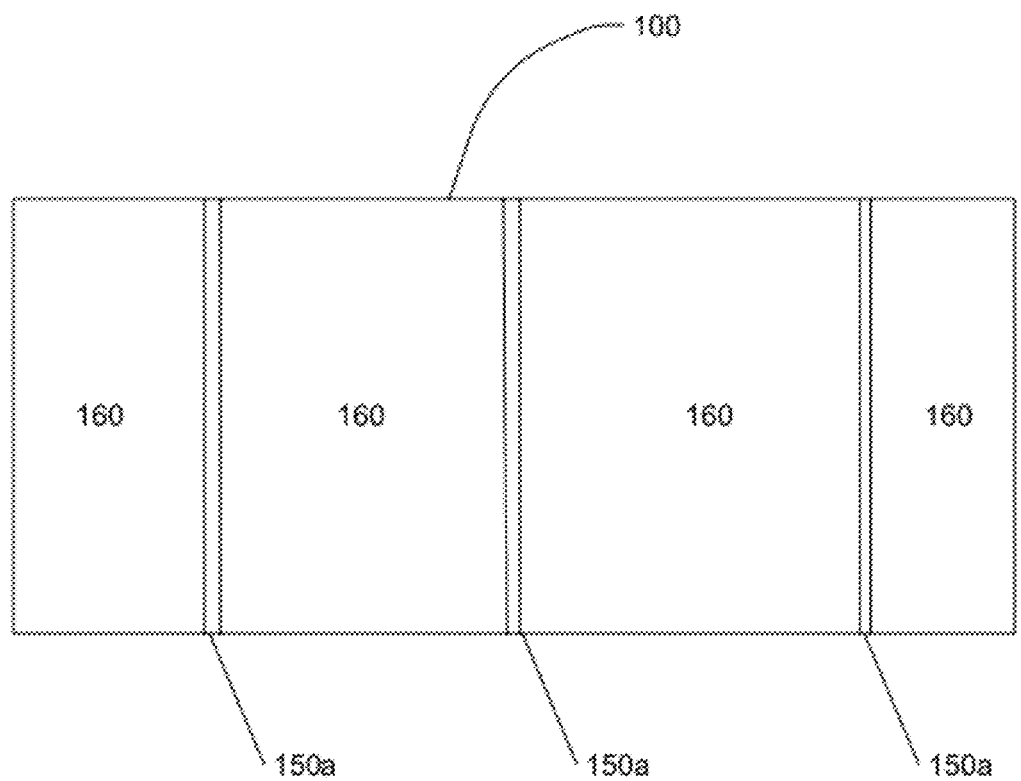
FIG. 2 shows a top view of the solar cell of FIG. 1.
Figure 3:
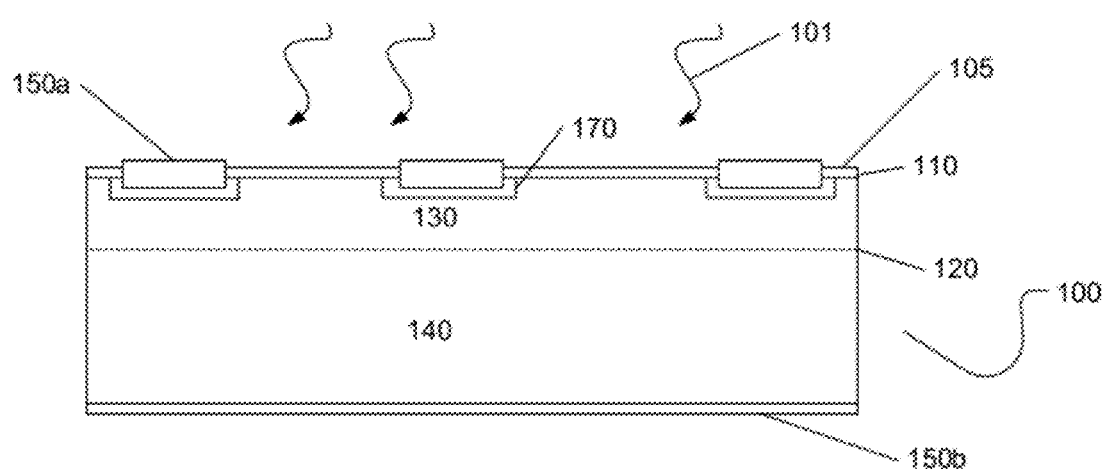
FIG. 3 shows a cross section of a solar cell using selective emitter design.
Figure 8B:
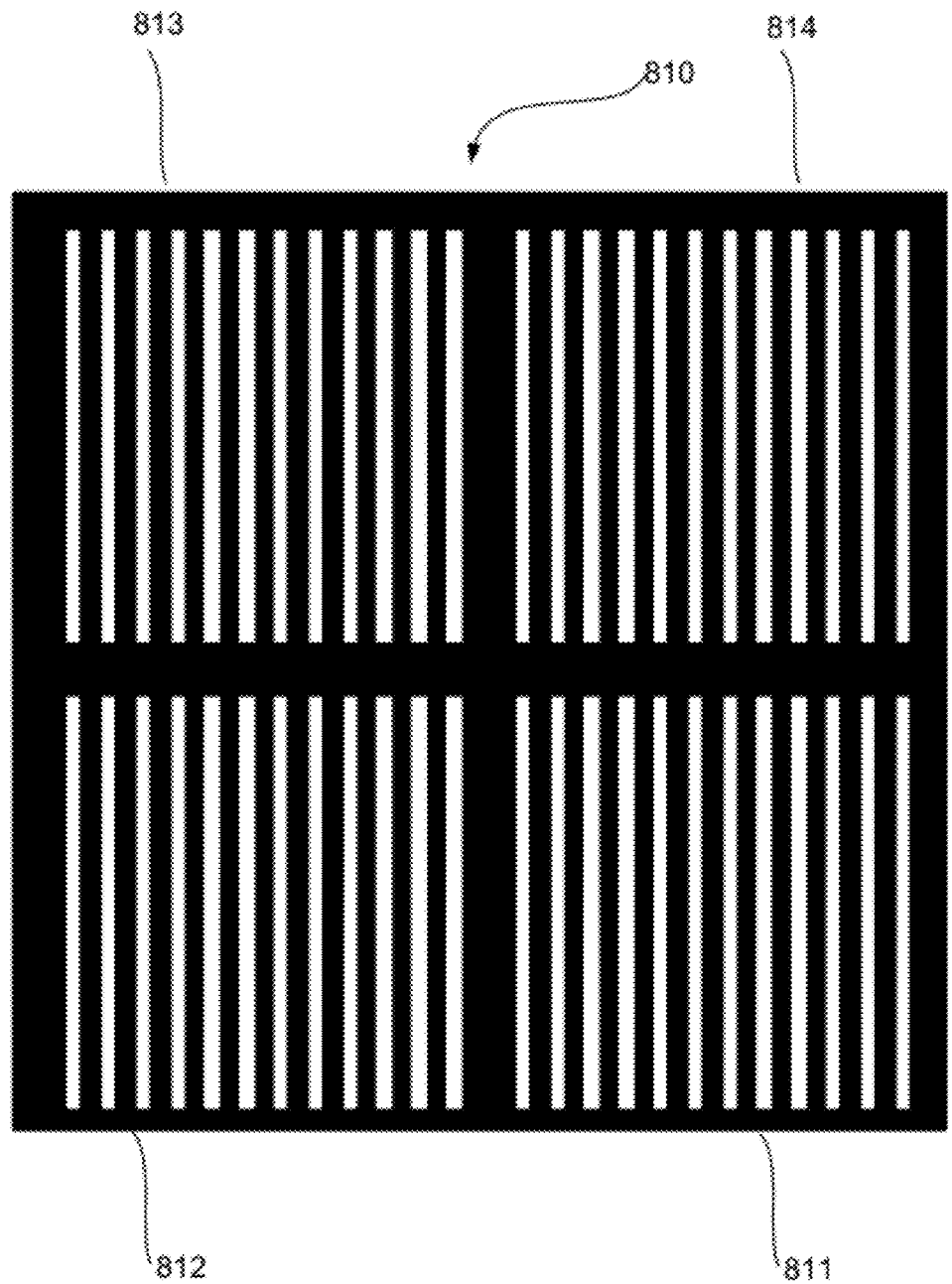
Figure 8C:
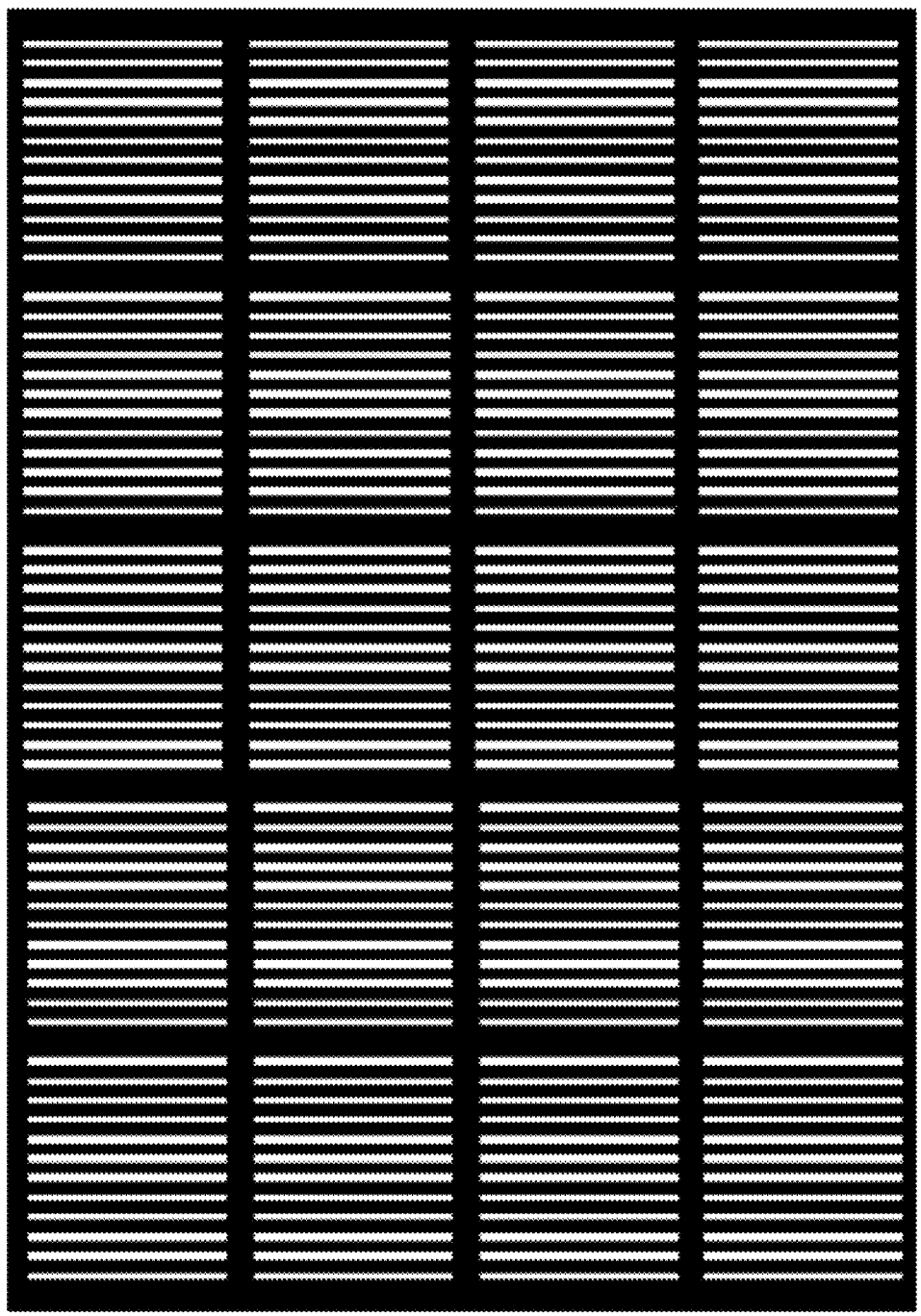

The carrier 800 may be constructed of any material capable of withstanding the ion implantation process, such as graphite, Silicon carbide or silicon. In some embodiments, the slots 805 are between 50 μm and 800 μm in width, and are used to create the highly doped selective emitter regions 170, as described in connection with FIG. 3. While FIG. 8A shows a substrate carrier 800 suitable for holding a single substrate, other embodiments are possible. FIG. 8B shows a substrate carrier 810 which is able to accommodate four substrates, located in positions 811-814. FIG. 8C shows a substrate 820 carrier configured to hold as many as 20 substrates. The size of the carrier and the number of substrates that can be supported is not limited by the present disclosure. Similarly, while FIGS. 8A-C show the pattern as a series of slots, other patterns may also be used and are within the scope of the disclosure.

As described above, one or more alignment features may be included in the carrier to properly position the substrate relative to the pattern. These alignment features may be on the side opposite that impacted by the ion beam. In one embodiment, two points are used to align to the edge of the substrate to reference the location of the pattern. The substrate could be referenced in two dimensions as well for two dimensional patterning. The referencing of the substrate to the carrier may be done by tipping the carrier and allowing the substrate to slide against the alignment feature due to the force of gravity. In another embodiment, alignment features are not used and can be replaced by an optical recognition system to align the doped lines to the metal lines at the metallization step. The alignment features may be in the carrier, in the mask or within the implanter. While gravity may be used to slide the substrates gently against an alignment feature, an active device, such as a robot, could be used as well.

In operation, the substrate is placed on a substrate carrier. The carrier may hold any number of substrates, as shown in FIGS. 8A-8C, although it is preferable that each substrate is positioned over a corresponding pattern. As described above, the pattern may be a series of apertures or slots that allow ions to be implanted into the substrate. The pattern of apertures or slots matches that which is to be implanted in the substrate. For example, the pattern of FIG. 8A can be used to implant the heavily n-doped contact regions 170 of FIG. 3. The substrate is placed on the carrier and may be aligned using alignment features located on the carrier, such as on the top surface of the carrier. The substrates may be held in position by, for example, gravity. In other words, the patterns of FIG. 8A-8C are created on the bottom surface of the carrier. The populated carrier is then placed in the process chamber.

Figure 9:
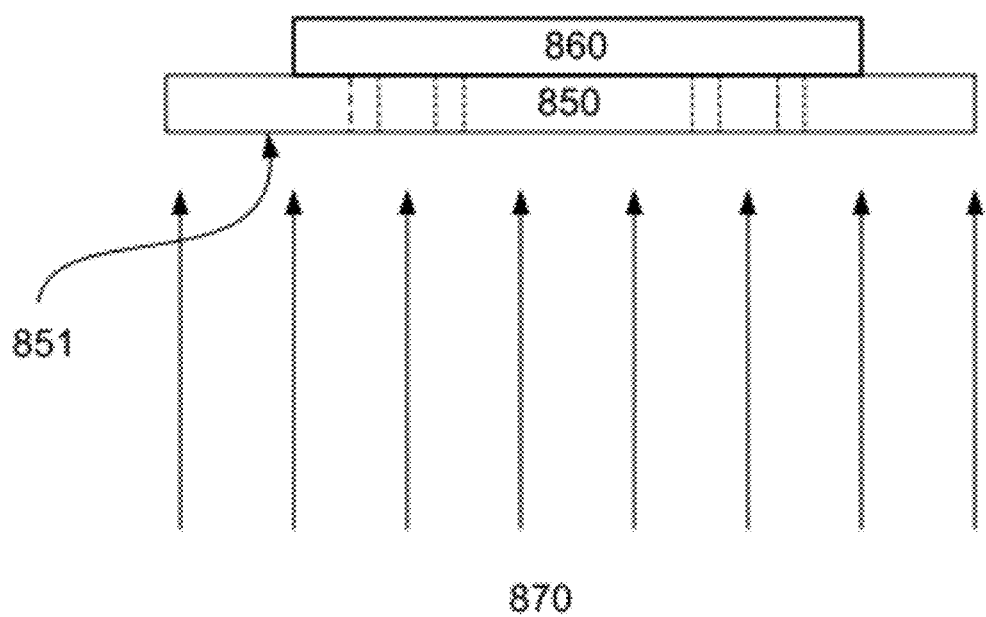
FIG. 9 shows the implant process according to one embodiment.

In some embodiments, as shown in FIG. 9, the carrier 850 remains horizontally oriented, such that its bottom surface 851 is parallel to ground. The ion beam 870 is then incident on the bottom surface 851 of the carrier, such that the dopant ions are implanted into the substrates 860 through the pattern of apertures on the bottom surface 851. In some embodiments, the carrier 850 is scanned through the ion beam 870, such that it moves while the beam is held stationary. In one particular instance, this carrier 850 is part of a conveyor belt. In other embodiments, the carrier 850 is held stationary and the ion beam 870 scans across the carrier. In the case of a pulsed plasma implant, the carrier 850 and substrate are stationary relative to the beam.

The ion beam 870 can be at any angle relative to the bottom surface 851 of the carrier 850, although in some embodiments, an ion beam 870 normal to the bottom surface 851 may be desirable. The angle of incidence can be modified by either changing the direction of the ion beam 870, tilting the carrier 850, or a combination of the two actions. In embodiments where gravity is used to hold the substrate 860 in place, the maximum angle of tilt may be limited.

In some embodiments, as described above, gravity is used to hold the substrate 860 in place in the carrier 850. In other embodiments, the substrate 860 is held in place, such as by an electrostatic or mechanical clamp, so that the carrier 850 can be tilted to a greater extent, such as completely vertically. For example, the pattern of the mask may serve as the active clamping surface.

Figure 10A:
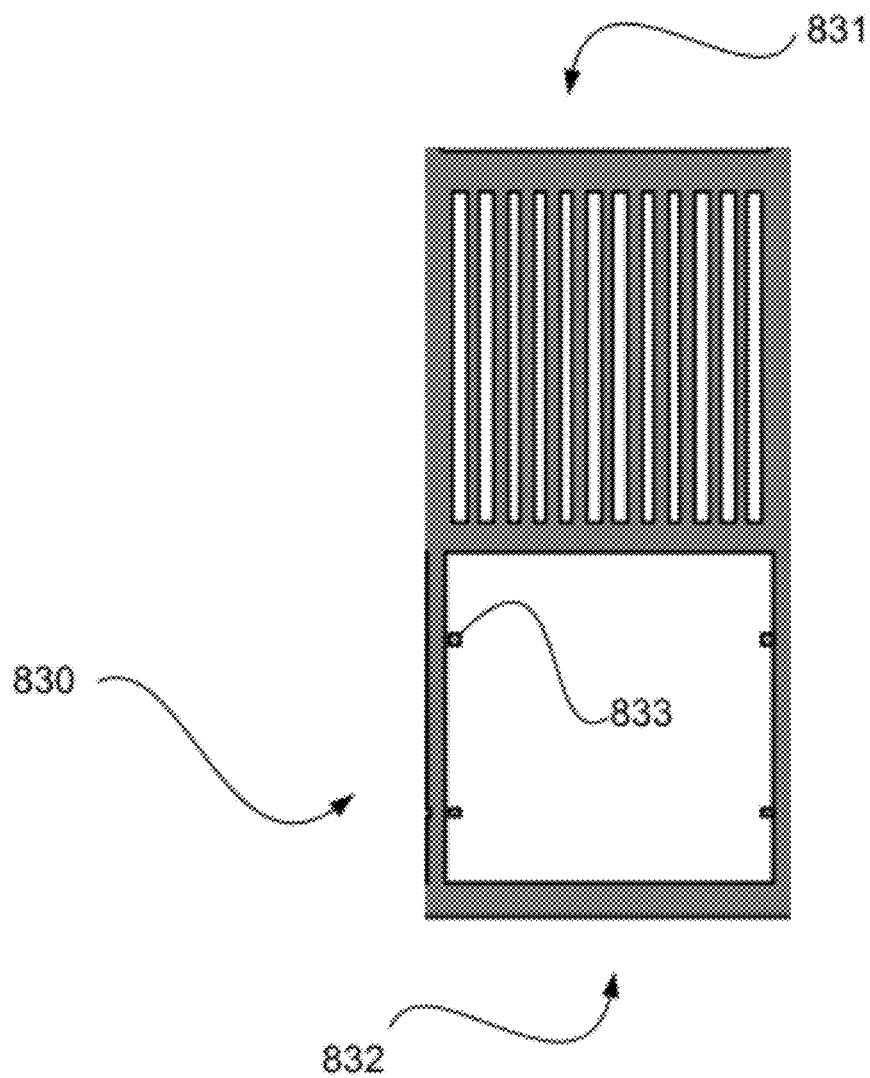
FIGS. 10A-10B are embodiments of a carrier having two different patterns.

FIGS. 8B-8C show a plurality of locations in which the substrates may be placed. In these figures, each location has an identical pattern. However, other embodiments are also possible. For example, FIG. 10A shows a carrier 830, which is configured to hold two substrates. The first location 831 has a pattern similar to that shown in FIGS. 8A-8C, which may be used to implant the heavily n-doped contact regions 170 of FIG. 3. The second location 832 has almost all of the material removed, such the almost the entire surface of the substrate located in second location 832 is implanted by the ion beam. Small tabs 833 may be used to support the substrate when in this position. A border or other edge also may be used. This second location 832 may be used to perform a blanket implant on the substrate.

In some embodiments, the carrier 830 may be loaded with two substrates, such that the first is positioned in first location 831 so that it is pattern implanted while the second is positioned in second location 832 and is blanket implanted. After the implant is completed, the positions of the substrates in the carrier 830 may be switched, such that the first substrate is now in second location 832 and is blanket implanted, while the second is pattern implanted in first location 831. Such an arrangement allows two separate process steps (blanket and pattern implantation) to be performed on two substrates using a single tool. The substrates may be changed using, for example, a substrate handling robot.

In another embodiment, a single substrate is loaded into carrier 830, such as in first location 831. The carrier 830 is then placed so as to be impacted by the ion beam. After the blanket implant is completed, the carrier 830 is shifted from first location 831 to second location 832. In some embodiments, the carrier is tilted such that the substrate slides from first location 831 to second location 832. In other embodiment, a substrate handling robot is used. At this point, the carrier 830 is again moved so as to be impacted by the ion beam. The substrate is now pattern implanted. In this way, a single substrate can have two implants performed on it using a single tool. This allows a substrate to receive both a blanket implant to create an emitter region 130 and a pattern implant to create heavily n-doped contact regions 170.

To improve alignment, the carrier 830 may be tilted toward first location 831 so that the substrate slides to the end of the carrier. After the first implant, the carrier 830 may be tilted toward second position 832 so that the substrate slides to the opposite end of the carrier 830. This method insures that the substrate is aligned with the patterns on the bottom surface of the carrier 830.

Figure 10B:
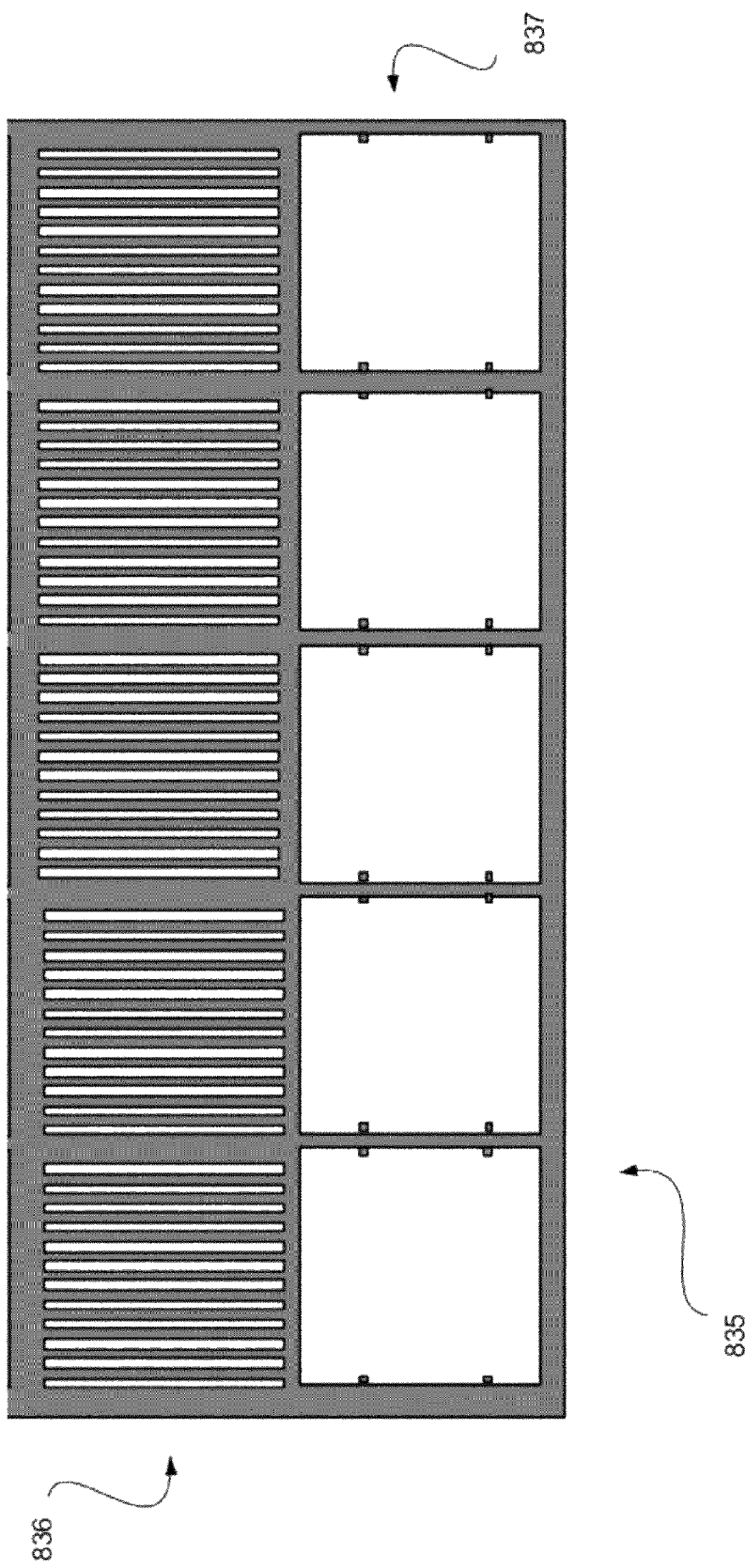

To improve yield, each location 831, 832 may be extended to form rows so as to hold a plurality of substrates, each substrate adjacent to the other, as shown in FIG. 10B. In this embodiment, the carrier 835 has two rows 836, 837, each capable of holding five substrates. The tilting process described above may be used to align all substrates located in row 836 first. After the implant is completed, the carrier 835 may be tilted slide the substrates into row 837. Note also that other methods may be user to shift the substrates from one row to the second row.

Figure 11:
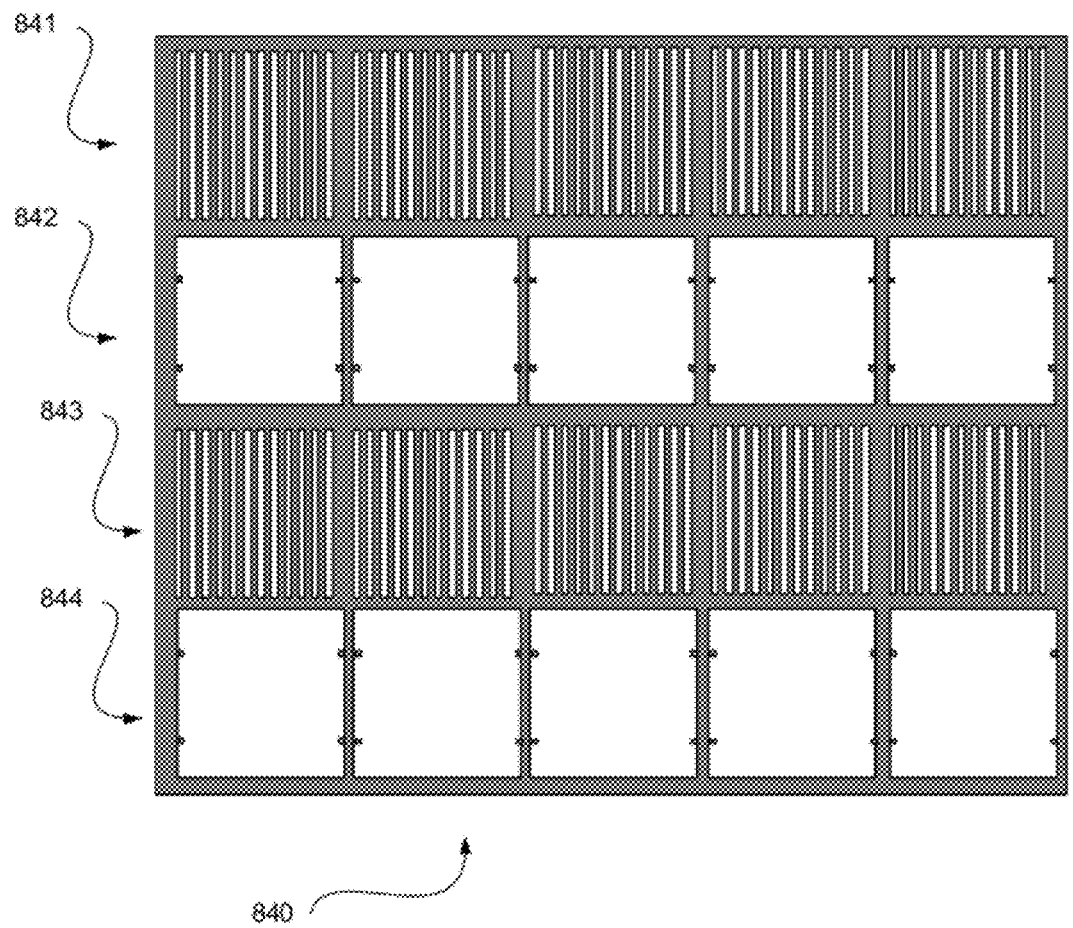
FIG. 11 shows another embodiment of a carrier having two different patterns.

FIG. 11 shows a larger carrier 840, having four rows 841-844 having two different patterns that can be used to simultaneously implant 20 substrates. The ten substrates in rows 841,843 may be pattern implanted. The ten substrates in rows 842, 844 may be blanket implanted. After this implant is completed, the substrates may be moved to another row to allow each substrate to receive both types or patterns of implants.

In another embodiment, the lowest row 844 is left vacant, such that substrates are only loaded into the top three rows 841-843 of the carrier 840. The carrier 840 is then moved so as to be impacted by the ion beam. After the implant is completed, the substrates are caused to shift downward by one row. In other words, the substrates in top row 841 are shifted to second row 842. Similarly, the substrates in rows 842, 832 and shifted to rows 843, 844 respectively. The carrier 840 is then moved so as to be impacted by the ion beam. In this way, the substrates each now receive a second implant, of a different type than the first implant. In other words, those which were blanket implanted in row 842 during the first implant are now pattern implanted in row 843. Those that were pattern implanted in row 841, 843 are now blanket implanted in rows 842, 844.

In some embodiments, the substrates are shifted from one row to an adjacent row by tilting the carrier. In this embodiment, the substrates slide until touching against substrates in an adjacent row or an alignment feature. In other embodiments, the substrates may be mechanically pushed from one row to another. Alternatively, the substrates may be held stationery, such as by electrostatic clamping, while the carrier is advanced.

The above description shows two patterns, where one is a series of slots and the second is for a blanket implant. However, the disclosure is not limited to these patterns. For example, two different patterns, each having a series of slots (perhaps oriented in different directions) may be used. Similarly, other types of patterns may be used for the various rows.

For example, it is possible to create two separate pattern features by referencing two different alignment features within the carrier. This technique would duplicate the same implant pattern on two different positions of the substrate. An advantage of this technique is that the irregularities contained within the pattern will always be matched by the duplicate. This technique may help with tolerancing between patterns.

In addition, the disclosure is not limited to only two patterns. Three or more different patterns can be used with a single carrier. Furthermore, if desired, each substrate may receive patterned implants using each of the patterns on the carrier. For example, a carrier may utilize three different patterns, A, B and C. These patterns may be arranged in adjacent rows, such as A, B, C, A, B. If substrates are placed in the first three rows, after two shifts and three implants, all substrates would have been implanted with patterns A, B and C. If desired, the substrates may be shifted fewer times, thereby creating substrates with different doping patterns on them. FIG. 12 shows the various doping patterns that can be achieved using adjacent rows having three different patterns, A, B and C. As can be seen, the doping patterns implanted in the substrates after 0 shifts or 1 shift are unique to the row in which the substrate was originally placed. Thus, using fewer than 2 shifts, it is possible to create substrates of different patterns. However, if the substrates are shifted 2 times, then all substrates are ultimately implanted with all three patterns. This concept can be expanded to an arbitrary number of patterns if desired. For example, if N patterns are used, N−1 shifts can be used to produce identical doping patterns on all substrate. A fewer number of shifts will create unique substrates. To allow N−1 shifts, it is necessary that at least this number of rows were not populated with substrates, thus allowing the placed substrates to be able to shift to unpopulated or vacant rows.

Figure 13:
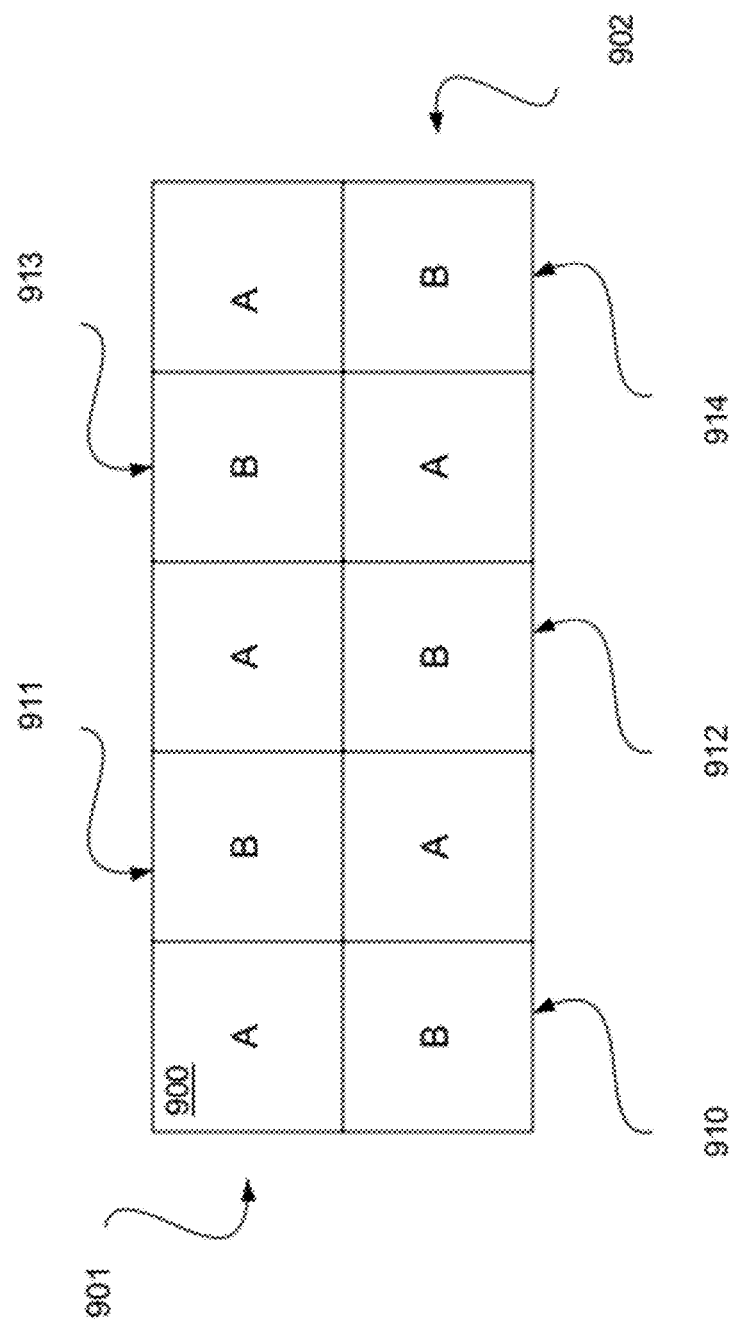
FIG. 13 shows another embodiment of a carrier having two different patterns.

In addition, although FIGS. 10 and 11 show that all patterns in a particular row are identical, this is not a limitations of the present disclosure. For example, in FIG. 13, the carrier 900 has two rows 901, 902. Each row has five positions of columns 910-914. The patterns of row 901 are arranged from left to right as A, B, A, B, A. To achieve uniform doping of all substrates, it may be desirable to have the opposite alternating set of patterns in row 902. For example, row 902 may have patterns B, A, B, A, B, such that each column 910-914 has both patterns in it. The patterns do not have to be arranged in alternating fashion as shown in FIG. 13. To achieve uniform doping of all substrates, it is only important that each column 910-914 has each type of pattern in it.

In addition, any of the above embodiments can be used for applications where there is a need to have successive implants of different species. For example, one pattern may be implanted with a first species, such as phosphorus, and another pattern may be implanted with a second species, such as boron. The carrier 840, such as those shown in FIGS. 10A-10B and 11, may be used for each implant with the position of the substrates shifting in the carrier between implant steps. The successive implants may be performed in different implanters, or they may be performed in two implanters that have been clustered into a single vacuum system, or they may be performed in the same process chamber from separate ion sources, or from a single ion source that can switch quickly between species.

Figure 14:
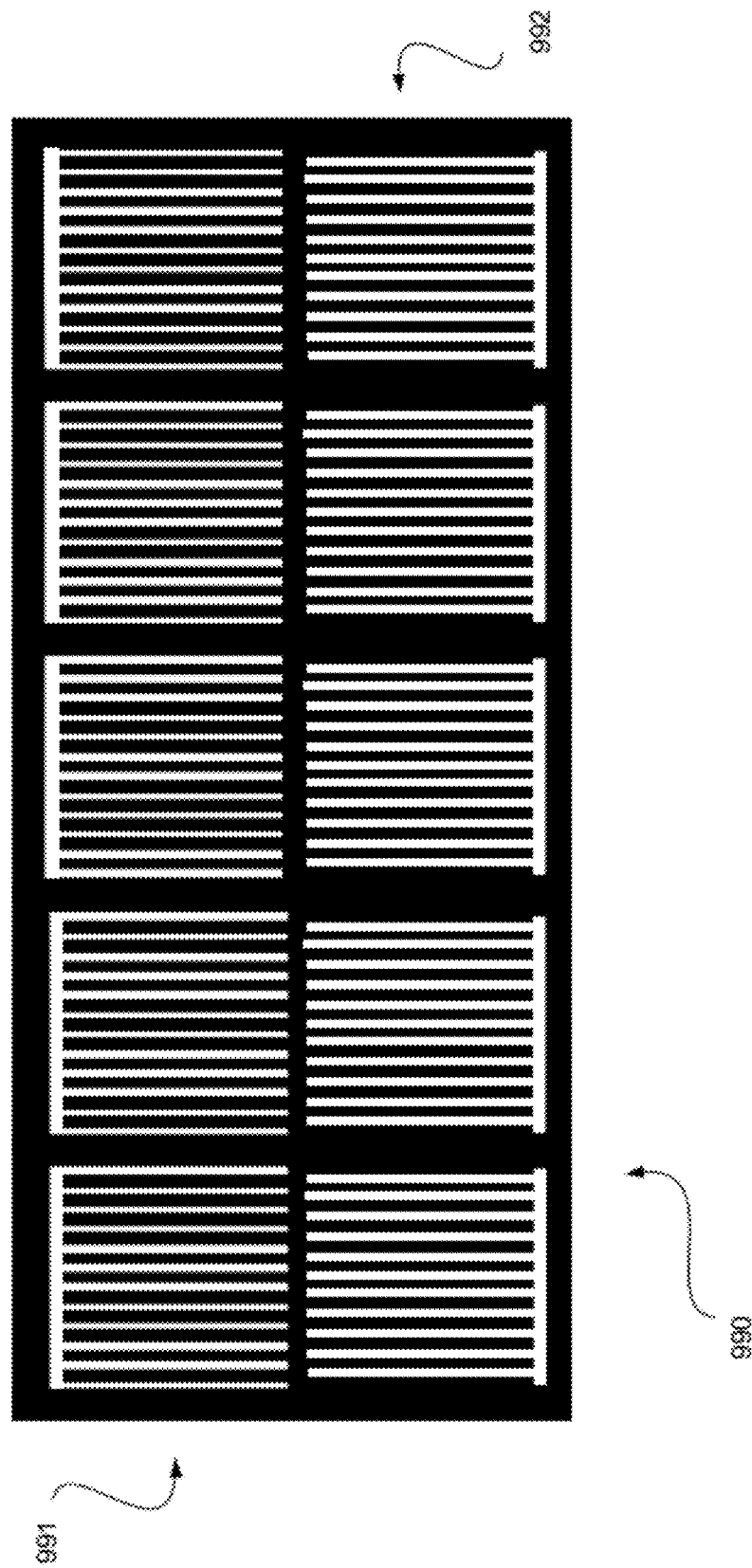
FIG. 14 shows another embodiment of a carrier having two different patterns suitable for an IBC solar cell.

FIG. 14 shows a carrier 990, with a first row 991 and a second row 992. The pattern in the first row 991 differs from that in the second row 992. In this embodiment, the patterns are created so as to implant an interdigitated back contact (IBC) for a solar cell. In one embodiment, the substrates are populated in first row 991. The substrates are then exposed to an ion beam, containing one species of dopant, such as for example n-type dopants. The substrates are then moved to the second row 992, using any of the methods described above and aligned. The substrates are then exposed to an ion beam, containing a second species of dopant, such as for example p-type dopants. The two patterns are created so as to create non-overlapping interdigitated regions of highly doped material. Such a doping pattern may be used on the back side of an IBC solar cell.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. An apparatus for ion implantation comprising:
   a carrier defining a surface on which a plurality of substrates rest using gravity, said carrier fabricated of a material selected from the group consisting of graphite, silicon carbide, and silicon, said carrier defining one or more apertures that extend through said carrier and comprise a pattern for ion implantation when said carrier is positioned parallel to the ground, and wherein said carrier is configured as a number of rows and a number of columns.

2. The apparatus of claim 1, wherein said carrier comprises a plurality of different patterns for ion implantation.

3. The apparatus of claim 2, wherein each of said columns comprises at least one of each of said plurality of different patterns.

4. The apparatus of claim 1, wherein said carrier comprises alignment features configured to align said substrates with said pattern.

5. A method of implanting ions into a substrate, comprising:
   positioning a carrier having a surface defining a plurality of apertures that extend through said carrier, wherein said apertures comprise a plurality of different patterns for ion implantation;
   placing said substrate on said carrier after said positioning such that said substrate is placed over at least one of said apertures;
   aligning said substrate with respect to at least one of said apertures; and implanting said substrate through at least one of said apertures with an ion beam that is projected in a direction opposite of gravity.

6. The method of claim 5, wherein said surface of said carrier comprises a plurality of locations where said substrate is placed and each of said locations comprise one of a plurality of different patterns for ion implantation.

7. The method of claim 6, further comprising
shifting said substrate from a first location on said carrier having a first pattern to a second location on said carrier having a different pattern from said first pattern after said implant step; and
performing a second implant such that said substrate is implanted using said first pattern and said different pattern.

8. The method of claim 7, wherein said carrier is tilted so that said substrate shifts from said first location to said second location.

9. The method of claim 7 wherein said first pattern comprises a patterned implant and said different pattern comprises a blanket implant.

10. The method of claim 9, wherein said patterned implant is used to form n-doped contact regions of a solar cell.

11. The method of claim 9, wherein said blanket implant is used to dope an emitter of a solar cell.

12. The method of claim 7, wherein said first pattern and said different pattern are implanted with different species.

13. The method of claim 12, wherein said different species comprise an n-type dopant and a p-type dopant.

14. The method of claim 5, wherein said ion beam is projected at an angle normal to said surface of said carrier.

15. A method of performing multiple ion implants using different patterns into a plurality of substrates, comprising:
providing a carrier having a plurality of locations where said substrates can be placed, wherein said plurality of locations is arranged as a plurality of rows and one or more columns, wherein a bottom surface of said carrier below each of said locations comprises one or more apertures configured to form one of a plurality of different implant patterns, and wherein each column comprises at least one of each of said different implant patterns;
placing said substrates in at least one row of said carrier;
implanting said substrates through said bottom surface of said carrier using a first implant pattern;
shifting said substrates from their current location to an adjacent row; and
implanting said substrates through said bottom surface of said carrier using a second implant pattern.

16. The method of claim 15, wherein said shifting and said implanting steps are repeated until each of said substrates has been implanted with each of said plurality of different implant patterns.

17. The method of claim 15, wherein at least one of said rows is unpopulated so as to allow said substrates to be able to shift to said unpopulated row.

18. The method of claim 15, wherein a number of rows that are not populated by said substrates is equal to or greater than one less than a number of said different implant patterns.

19. The method of claim 15, wherein said implanting using said first implant pattern and said second implant pattern comprises using different species.

20. The method of claim 19, wherein said different species comprise an n-type dopant and a p-type dopant.

* * * * *